United States Patent
Chung

(10) Patent No.: US 8,362,937 B2
(45) Date of Patent: Jan. 29, 2013

(54) INTEGRATED CIRCUITS FOR CONVERTING ANALOG SIGNALS TO DIGITAL SIGNALS, SYSTEMS, AND OPERATING METHODS THEREOF

(75) Inventor: Shine Chung, San Jose, CA (US)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 143 days.

(21) Appl. No.: 12/791,963

(22) Filed: Jun. 2, 2010

(65) Prior Publication Data

US 2010/0315271 A1 Dec. 16, 2010

Related U.S. Application Data

(60) Provisional application No. 61/186,533, filed on Jun. 12, 2009.

(51) Int. Cl.
*H03M 1/12* (2006.01)
(52) U.S. Cl. ........................ 341/156; 341/155
(58) Field of Classification Search .................. 341/155, 341/156, 118, 120, 158, 159, 119, 157; 375/340, 375/155
See application file for complete search history.

(56) References Cited

U.S. PATENT DOCUMENTS

| | | |
|---|---|---|
| 3,971,923 A | 7/1976 | Linder |
| 5,463,395 A | 10/1995 | Sawai |
| 5,631,941 A * | 5/1997 | Shou et al. .................. 377/75 |
| 6,407,685 B1 | 6/2002 | Handel et al. |
| 2005/0280568 A1 | 12/2005 | Rowland et al. |
| 2006/0114140 A1 | 6/2006 | Hsueh |
| 2007/0096971 A1 | 5/2007 | Tero |
| 2007/0176816 A1 | 8/2007 | Wood |
| 2007/0200746 A1 | 8/2007 | Sutardja |
| 2008/0136688 A1 | 6/2008 | Tero |
| 2008/0192867 A1 * | 8/2008 | Mehrnia et al. ............ 375/343 |
| 2009/0091483 A1 | 4/2009 | Venkataraman et al. |
| 2009/0167582 A1 * | 7/2009 | Makihara et al. ........... 341/144 |

FOREIGN PATENT DOCUMENTS

| | | |
|---|---|---|
| JP | 59023624 | 2/1984 |
| JP | 5199116 | 8/1993 |
| JP | 6112827 | 4/1994 |
| JP | 9107289 | 4/1997 |

OTHER PUBLICATIONS

OA dated Mar. 28, 2012 from corresponding application No. JP 2010-133536.

* cited by examiner

*Primary Examiner* — Joseph Lauture
(74) *Attorney, Agent, or Firm* — Lowe Hauptman Ham & Berner, LLP

(57) ABSTRACT

An integrated circuit that is capable of converting an analog signal to at least one digital signal is provided. The integrated circuit includes a first input end capable of receiving a first analog signal. A first set of $2^n-1$ inverters are capable of quantizing the first analog signal and outputting a first set of $2^n-1$ digital values. Each of the first set of $2^n-1$ digital values is either 0 or 1. A first adder is coupled with the first set of $2^n-1$ inverters. The first adder is capable of summing the first set of $2^n-1$ digital values, outputting a first integer value that is capable of corresponding to at least one digital signal.

19 Claims, 12 Drawing Sheets

US 8,362,937 B2

INTEGRATED CIRCUITS FOR CONVERTING ANALOG SIGNALS TO DIGITAL SIGNALS, SYSTEMS, AND OPERATING METHODS THEREOF

CROSS-REFERENCE TO RELATED APPLICATIONS

The present application claims priority of U.S. Provisional Patent Application Ser. No. 61/186,533, filed on Jun. 12, 2009, which is incorporated herein by reference in its entirety.

TECHNICAL FIELD

The present disclosure relates generally to the field of semiconductor circuits, and more particularly, to integrated circuits for converting analog signals to digital signals, systems, and operating methods thereof.

BACKGROUND

Analog-to-digital converters (ADC) can convert analog signals to digital signals. ADCs have been used in determining the quality and the speed of many electronic systems. One type of commonly-used ADC is a flash ADC. The flash ADC can perform fast analog-to-digital conversions, has little intrinsic delays, and is easy to design. The flash ADC is often used in extremely high-speed electronic systems.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the numbers and dimensions of the various features may be arbitrarily increased or reduced for clarity of discussion.

DETAILED DESCRIPTION

Figure 1A:
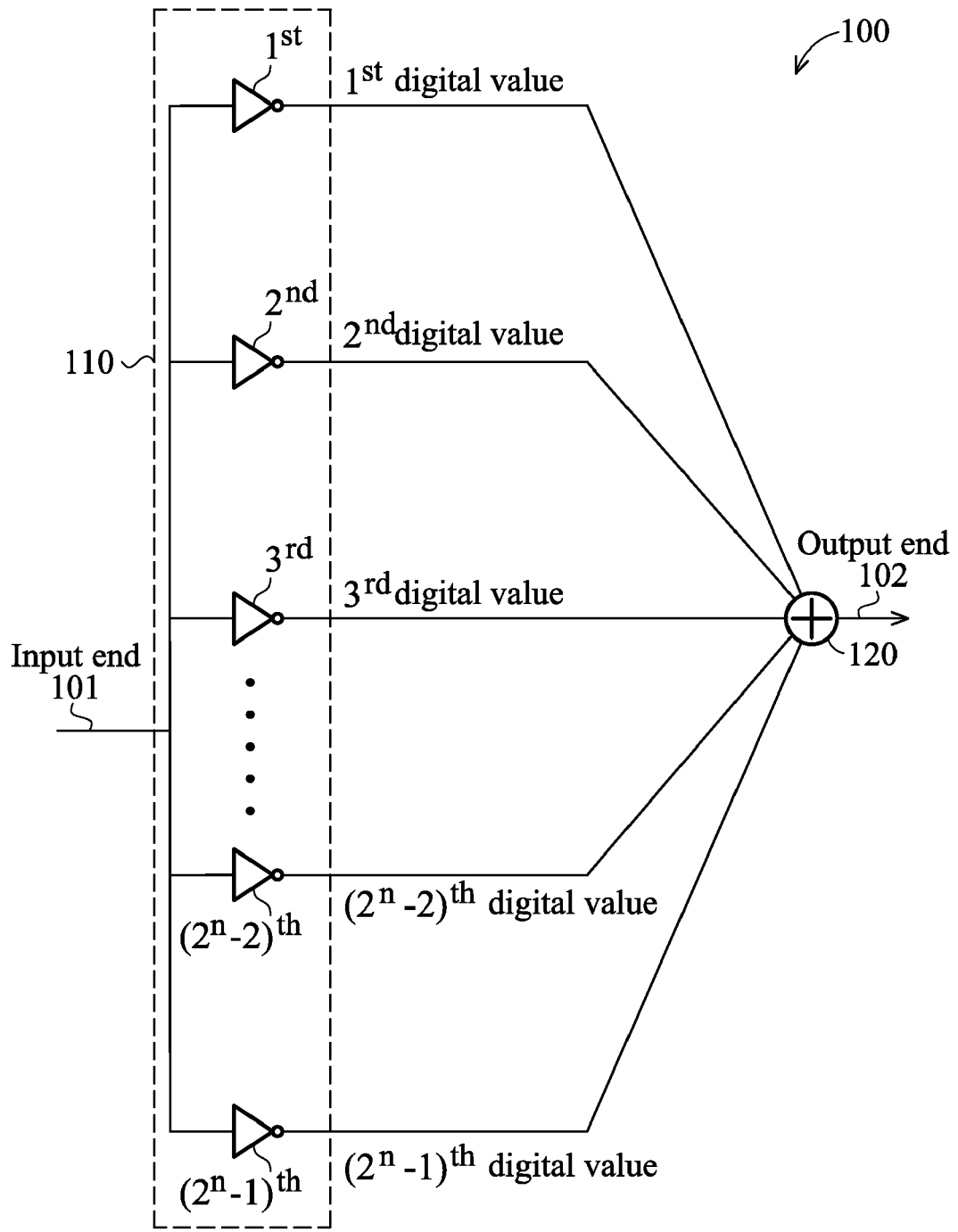
FIG. 1A is a schematic drawing showing an exemplary integrated circuit that is capable of converting analog signals to digital signals.

A conventional flash ADC has $2^n-1$ comparators and a voltage ladder including $2^n$ resistors for an n-bit resolution of analog-to-digital conversions. Each rung of the voltage ladder is applied to a negative input end of its corresponding comparator as a reference voltage. Each of the comparators compares the reference voltage from the rung of the voltage ladder and the input voltage to output a digital signal. By outputting $2^n-1$ digital levels, an n-bit binary digital signal can be provided.

It is found that the conventional flash ADC uses $2^8-1$ or 255 comparators to provide an 8-bit resolution for analog-to-digital conversions. The large number of comparators will cost a huge area of the conventional flash ADC. It is also found that the voltage ladder is coupled between a power supply and ground. During the analog-to-digital conversions, each resistor of the voltage ladder consumes powers from the power supply. The huge area of the conventional flash ADC and high-power consumption become worse if a high bit resolution, e.g., higher than an 8-bit resolution is desired.

Based on the foregoing, integrated circuits that can convert analog to digital signals, systems, and operating methods thereof are desired.

It is understood that the following disclosure provides many different embodiments, or examples, for implementing different features of the disclosure. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "below," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

FIG. 1A is a schematic drawing showing an exemplary integrated circuit that is capable of converting analog signals to digital signals. In FIG. 1A, an integrated circuit 100 can include an input end 101 that is capable of receiving an analog signal and an output end 102 that can output an integer value (in digital form) corresponding to the analog signal. The integrated circuit 100 can include a set of $2^n-1$ inverters 110. The $2^n-1$ inverters 110 are capable of receiving the analog signal from the input end 101. In some embodiments, the $2^n-1$ inverters 110 can be disposed in a parallel fashion and coupled with the input end 101. The $2^n-1$ inverters 110 can quantize the analog signal, outputting a set of $2^n-1$ digital values. Each of the $2^n-1$ digital values can be either 0 or 1. The integrated circuit 100 can include an adder 120. The adder 120 can be coupled with the $2^n-1$ inverters 110. The adder 120 can be configured to sum the set of $2^n-1$ digital values, outputting the integer value corresponding to at least one digital signal at the output end 102. The integrated circuit 100 can include a flash analog-to-digital converter (ADC), a successive-approximation ADC, a ramp-compare ADC, a Wilkinson ADC, an integrating ADC, a delta-encoded ADC, a pipeline ADC, a sigma-delta ADC, a time-interleaved ADC, and other ADC. In some embodiments, the integrated circuit 100 can be a signal processor, a control circuit, a power control circuit, or any circuit that is capable of converting analog signals to digital signals.

Figure 2A:
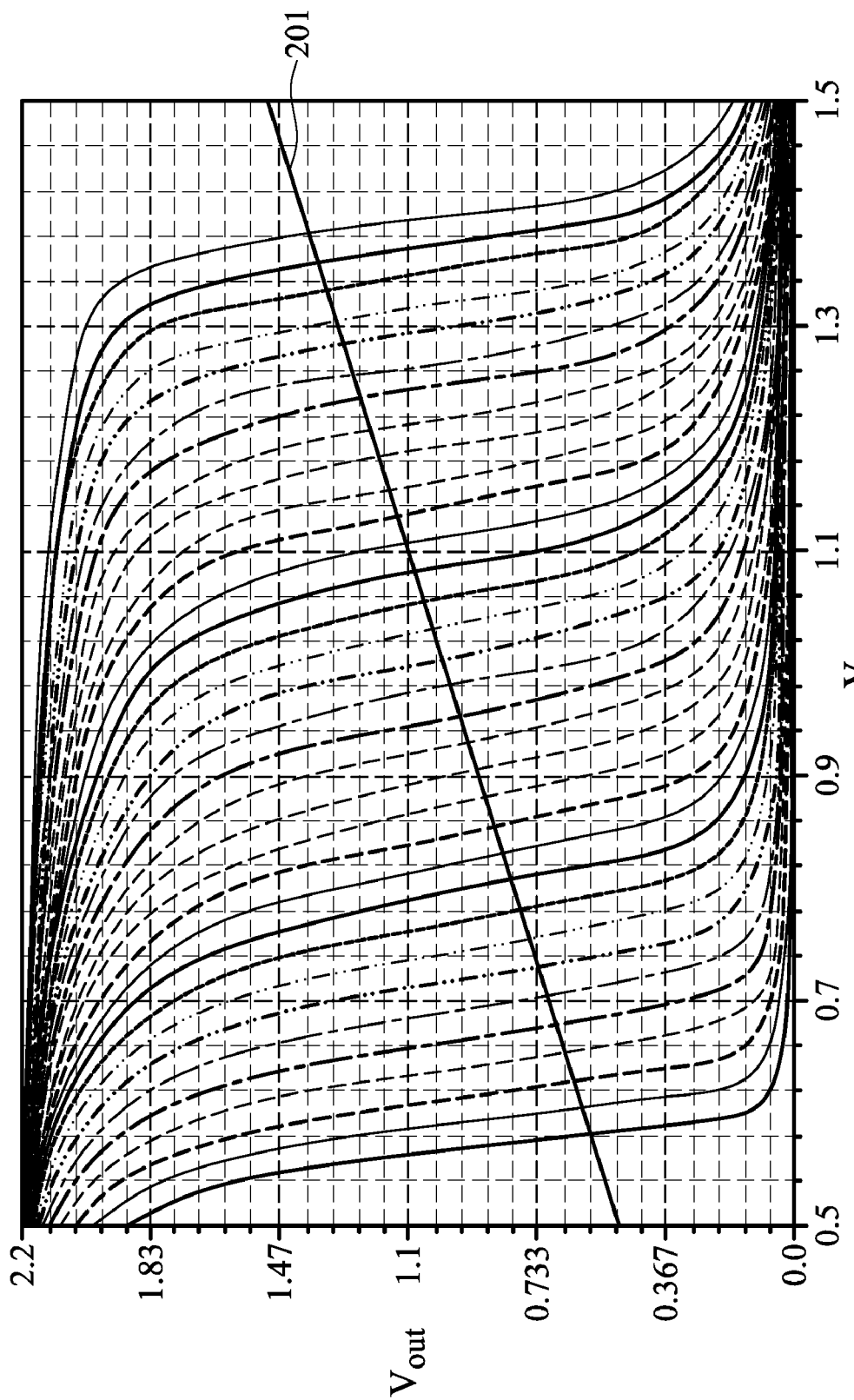
FIG. 2A is a schematic drawing illustrating voltage transfer curves (VTC) of simulations of various inverters.

Following is a description regarding quantizing an analog signal with 5-bit analog-to-digital conversion resolution. It is noted that the description is merely exemplary. The embodiment described below can provide a high analog-to-digital conversion resolution, e.g., 8-bit resolution or higher. In some embodiments using 5-bit analog-to-digital conversion resolution, the $2^n$-1 inverters 110 can have $2^5$-1 or 31 inverters. Each of the 31 inverters can have its corresponding voltage transfer curve (VTC) and trip point as shown in FIG. 2A. A line 201 may substantially pass all of the trip points of the 31 inverters as shown in FIG. 2A. In some embodiments, each of the 31 inverters can include a complementary metal-oxide-semiconductor (CMOS) transistor. The CMOS transistor can have a PMOS transistor and an NMOS transistor. The PMOS transistors and NMOS transistors can have, for example, different ratios of channel widths to channel lengths (W/L) such that the $2^n$-1 inverters 110 can have different trip points.

For example, the analog signal at the input end 101 can have an input voltage of about 1.018 V. As shown in FIG. 2A, the $1^{st}$ inverter to the $16^{th}$ inverter can have trip points that are higher than 1.018 V and each of the 16 inverters can output a digital value "1." The $17^{th}$ inverter to the $31^{st}$ inverter can have trip points that are lower than 1.018 V and each of the 15 inverters can output a digital value "0."

Referring to FIG. 1A, the adder 120 can sum the digital values output from the 31 inverters, outputting an integer value (in digital form). For embodiments using the analog signal having the input voltage of about 1.018 V, the adder 120 can output the integer value "15" at the output end 102. The integer value "15" may be decoded as a 5-bit binary digital signal, e.g., 01111, for digital processing.

It is noted that the $2^n$-1 inverters 110 can desirably quantize the analog signal to $2^n$ levels, outputting the $2^n$-1 integer values. The adder 120 can add the $2^n$-1 integer values, outputting the integer value. The integrated circuit 100 can desirably convert the analog signal to the integer value that can represent a digital signal at a desired converting rate. It is also found that the $2^n$-1 inverters 110 uses an area smaller than that of $2^n$-1 comparators of the conventional flash ADC. The chip size of the integrated circuit 100 can be desirably reduced.

In some embodiments, the adder 120 can be coupled with a lookup table (not shown). The lookup table can receive the integer value output from the adder, desirably outputting an n-bit digital binary signal corresponding to the integer value. By free from including a complex decoding operation, the lookup table can help to convert the analog signal to the digital signal at a desired speed.

Figure 1B:
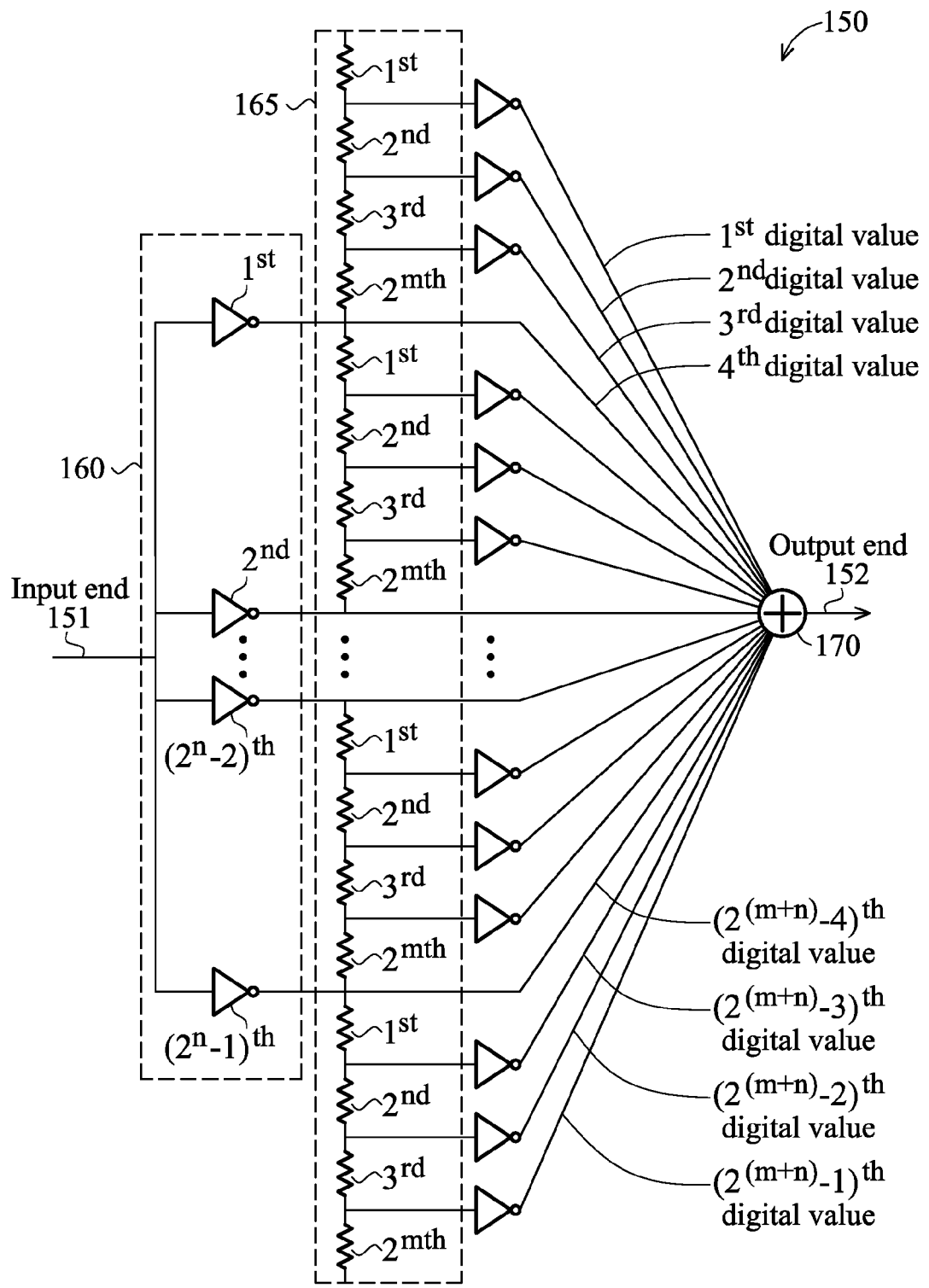
FIG. 1B is a schematic drawing showing another exemplary integrated circuit including inverters and voltage dividers for converting an analog signal to a digital signal.

FIG. 1B is a schematic drawing showing another exemplary integrated circuit including inverters and voltage dividers for converting an analog signal to a digital signal. Items of FIG. 1B that are the same or similar items in FIG. 1A are indicated by the same reference numerals increased by 50. In some embodiments, an integrated circuit 150 can include dummy inverters 161a and 161b. The levels provided by the inverters 160 can be further quantized by voltage dividers. In embodiment for further quantizing the analog signal, the integrated circuit 150 can include a plurality of voltage dividers 165, e.g. $2^m$ voltage dividers. Each output end of the $2^n$-1 inverters can be coupled with at least one of the voltage dividers 165. Each of the voltage dividers 165 can include a set of $2^m$ electronic components, e.g., resistors, diodes, other electronic components that are capable of providing desired impedances, and/or any combinations thereof. Each of the voltage dividers 165 can provide $2^m$-1 digital values. Each of the $2^m$-1 digital values can be either "0" or "1." The voltage dividers 165 can provide $2^n \times (2^m$-1) digital values. The $2^n$-1 inverters 160 and $2^{(n+m)}$ electronic components can provide $2^{(n+m)}$-1 integer values that can represent a (n+m)-bit resolution for an analog-to-digital conversion. For embodiments using a 7-bit analog-to-digital conversion resolution, the integrated circuit 150 can have $2^5$-1 inverters and $2^{(5+2)}$ electronic components.

Following is an exemplary description regarding the inverters and the electronic component quantization the analogy signal. In embodiments using a 7-bit analog-to-digital conversion resolution, the integrated circuit 150 can include $2^5$-1 or 31 inverters 160 and 32 voltage dividers 165. Each of the 32 voltage dividers 165 can have $2^2$ or 4 resistors. Since each of the resistors can further divide the voltage drop between output ends of two adjacent inverters, the 31 inverters and 32 voltage dividers are capable of providing 127 digital values.

Figure 2B:
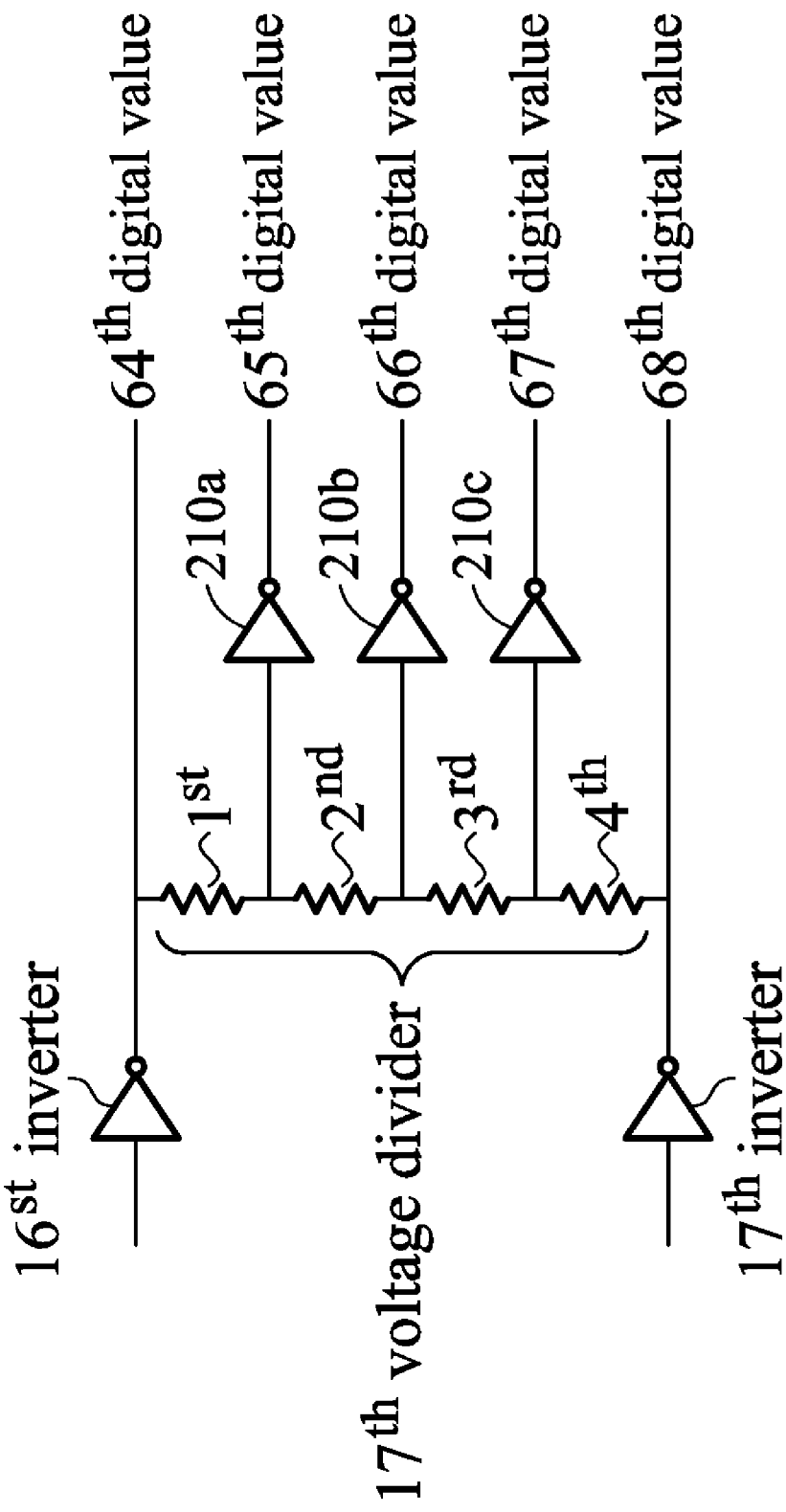
FIG. 2B is a schematic drawing illustrating a portion of the integrated circuit shown in FIG. 1B.
Figure 2C:
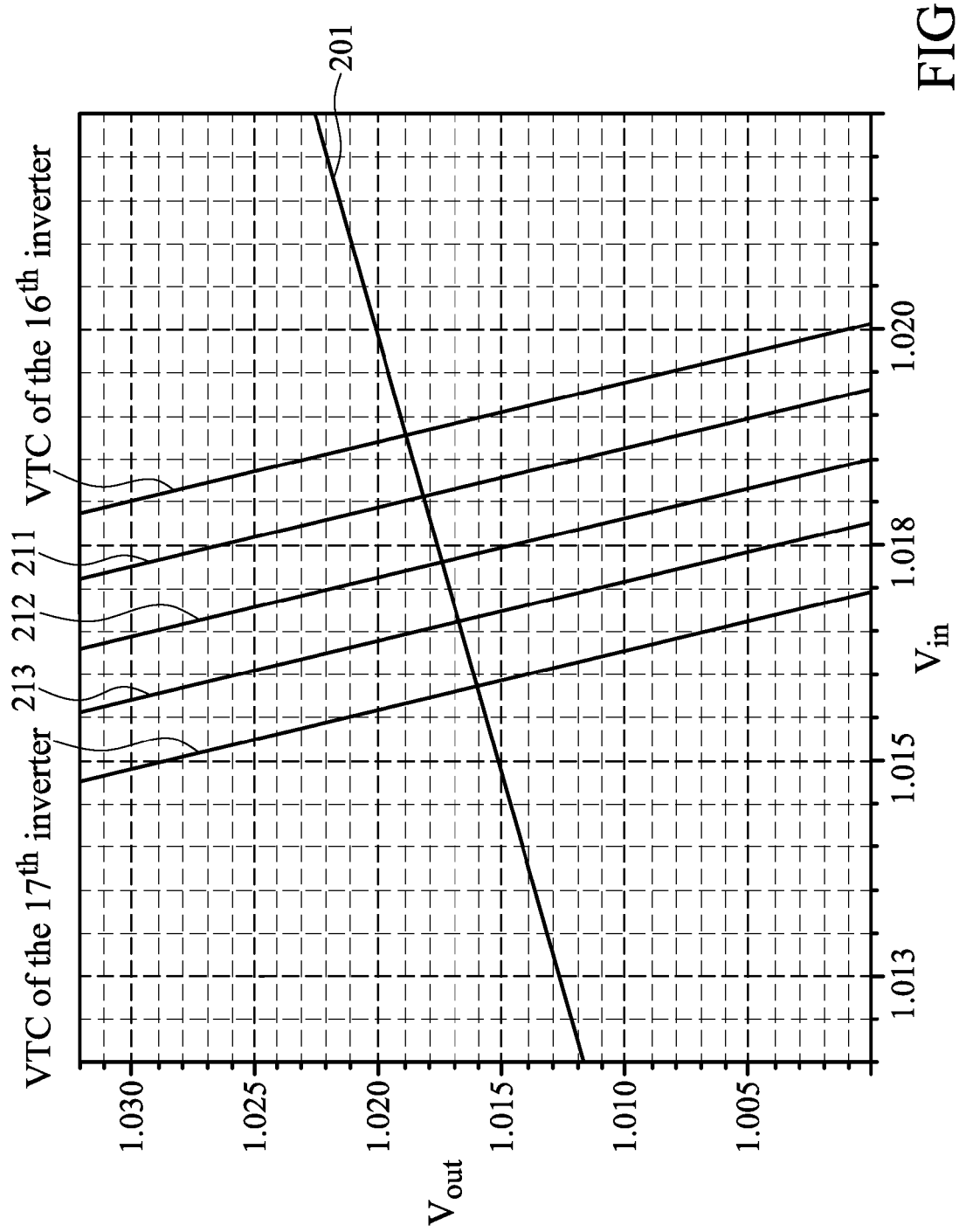
FIG. 2C is a schematic drawing illustrating additional VTCs provided by a voltage divider between two VTCs provided by two adjacent inverters.

For example, a $17^{th}$ voltage divider (shown in FIG. 2B) can be disposed between the $16^{th}$ inverter and the $17^{th}$ inverter. The $17^{th}$ voltage divider can further quantize the voltage drop between the $16^{th}$ inverter and the $17^{th}$ inverter. In some embodiments, the quantization by the $17^{th}$ voltage divider can be referred to as an interpolation. The $17^{th}$ voltage divider can include 4 resistors, e.g., $1^{st}$-$4^{th}$ resistors. Each output end of the $17^{th}$ voltage divider and the $16^{th}$ and $17^{th}$ inverters can be coupled with one of inverters 210a-210e. The inverters 210b-210d can provide VTCs 211-213, respectively, between the VTCs of the $16^{th}$ inverter and the $17^{th}$ inverter (shown in FIG. 2C). For some embodiments, the analog signal can have an input voltage of about 1.018 V. As noted, 1.018 V of the analog signal is lower than the trip point of the $16^{th}$ inverter and higher than the trip point of the $17^{th}$ inverter. It is also found that 1.018 V of the analog signal can be lower than the trip point of the VTC 211 and higher than the trip points of the VTCs 212 and 213. The $65^{th}$ digital value can be "1" and the $66^{th}$ and $67^{th}$ digital values can be "0." Also noted, the digital values output from the $1^{st}$-$16^{th}$ voltage dividers are "1" and the digital values output from the $18^{th}$-$32^{nd}$ voltage dividers are "0."

Referring to FIG. 1B, the adder 170 can sum the digital values output from the 31 inverters and the 32 voltage dividers, outputting an integer value. For embodiments using the analog signal having the input voltage of about 1.018 V, the adder 170 can output the integer value "65" at the output end 152. In some embodiments, the integer value "65" may be decoded as a 7-bit binary digital signal, e.g., 1000001, for digital processing.

As noted, the conventional ADC uses a plurality of comparators to quantize the input analog signal. To achieve a 7-bit resolution, $2^7$-1, i.e., 127, comparators are used. The 127 comparators call for a large area of the conventional ADC. Additionally, the conventional ADC uses a resistor network to provide different voltage levels as reference voltages of the comparators. The resistor network consumes some power of the conventional ADC.

In contrary to the conventional ADC, the integrated circuit 150 uses the inverters 160 and the voltage dividers 165 to quantize the analog signal. As noted, the integrated circuit 150 can include $2^5$-1, e.g., 31 inverters and $2^{(5+2)}$ electronic components, e.g., 128 resistors to achieve a 7-bit resolution of the analog-to-digital conversion. It is found that the 31 inverters 160 and the 32 voltage dividers 165 use an area that is smaller than that of the 127 comparators of the conventional ADC. The size of the integrated circuit 150 can be desirably reduced. The size reduction of the integrated circuit 150 can be desirably achieved if the analog-to-digital conversion resolution is an 8-bit resolution or more.

It is also found that the integrated circuit 150 is free from including a resistor network for providing voltage levels as reference voltages for the comparators. The power consumption of the resistor network can be desirably reduced. It is noted that the 7-bit analog-to-digital conversion resolution described above is merely exemplary. The scope of the application is not limited thereto. One of skill in the art can modify the numbers of the $2^n-1$ inverters 160 and the $2^m$ electronic components to achieve a desired (n+m)-bit analog-to-digital conversion resolution.

Figure 3B:
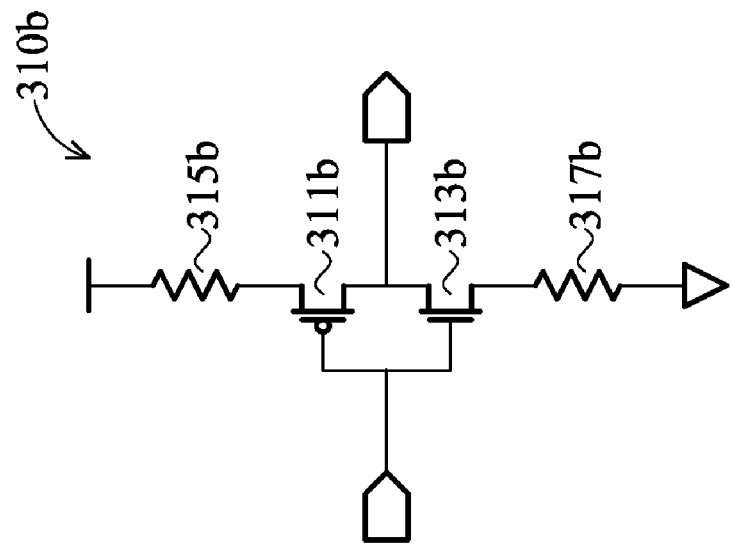
FIGS. 3A-3D are schematic drawings illustrating various exemplary inverters.
Figure 3A:
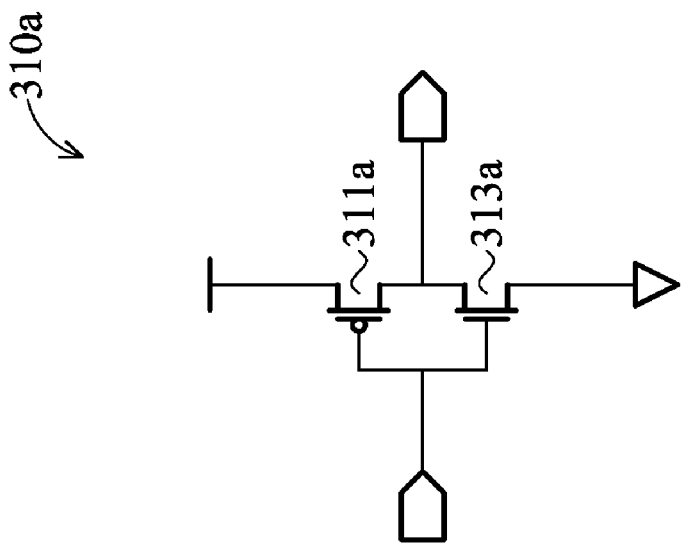

FIGS. 3A-3D are schematic drawings illustrating various exemplary inverters. As noted, each of the inverters 110 (shown in FIG. 1A), 160 (shown in FIG. 1B), and/or 210a-210e (shown in FIG. 2B) can include a CMOS transistor. In FIG. 3A, an inverter 310a can include a PMOS transistor 311a and an NMOS transistor 313a. A source end of the PMOS transistor 311a can be coupled with a power source, e.g., VDD of about 2.2 V. A source end of the NMOS transistor 313a can be coupled with ground. In some embodiments, the W/L ratio of the PMOS transistor 311a can vary from about 0.6/0.18 to about 9.08/0.18. The W/L ratio of the PMOS transistor 311a can vary from about 0.6 μm/0.18 μm to about 8.26 μm/0.18 μm. The variations of the W/L ratios of the PMOS transistor 311a and NMOS transistors 313a can provide different trip points.

In FIG. 3B, an inverter 310b can include a PMOS transistor 311b and an NMOS transistor 313b. The PMOS transistor 311b and the NMOS transistor 313b can be similar to the PMOS transistor 311a and the NMOS transistor 313a, respectively. The source end of the PMOS transistor 311b can be coupled with a resistor 315b. The source end of the NMOS transistor 313b can be coupled with a resistor 317b. In some embodiments, the resistors 315b and 317b can have a resistance of about 1.8 KΩ.

Figure 3D:
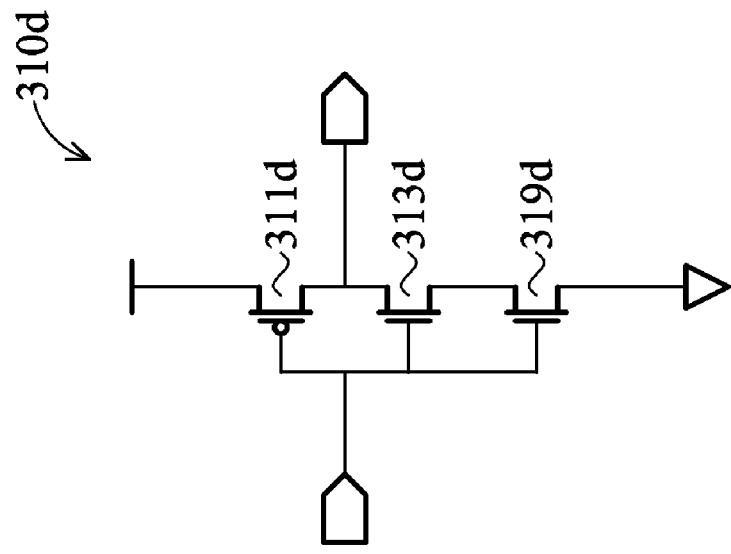
Figure 3C:
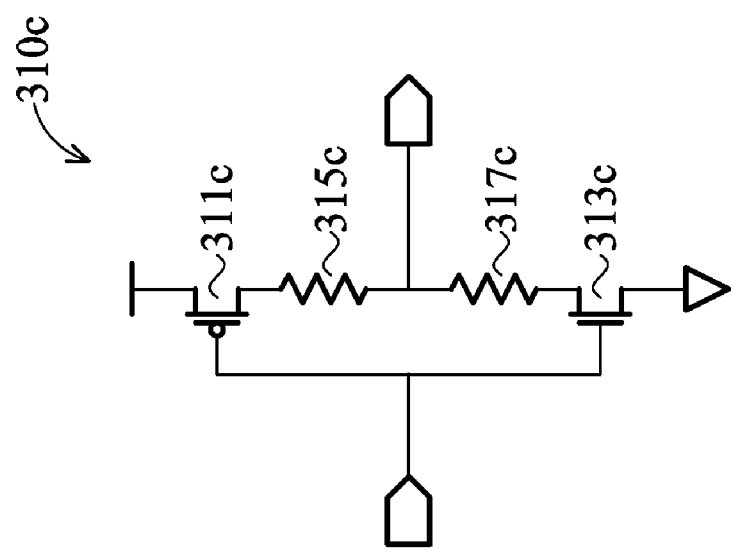

In FIG. 3C, an inverter 310c can include a PMOS transistor 311c and an NMOS transistor 313c. The drain end of the PMOS transistor 311c can be coupled with a resistor 315c. The drain end of the NMOS transistor 313c can be coupled with a resistor 317c. In embodiments, the resistors 315c and 317c can have a resistance of about 1.8 KΩ.

In FIG. 3D, and inverter 310d can include a PMOS transistor 311d and NMOS transistors 313d and 319d. The NMOS transistor 313d can be coupled between the PMOS transistor 311d and the NMOS transistor 319d. The source end of the PMOS transistor 311d can be coupled with a power source, e.g., Vdd of about 2.2 V. The source end of the NMOS transistor 319d can be coupled with ground. In some embodiments, the NMOS transistors 313d and 319d can have the same W/L ratio.

It is noted that the W/L ratios of the PMOS and NMOS transistors and/or resistances of the resistors described above are merely exemplary. One of skill in the art can modify the W/L ratios and resistances to achieve desired trip points. It is also noted that the structures of the inverters 310a-310d are merely exemplary. Any inverter structure that can provide a desire VTC can be used.

Figure 4:
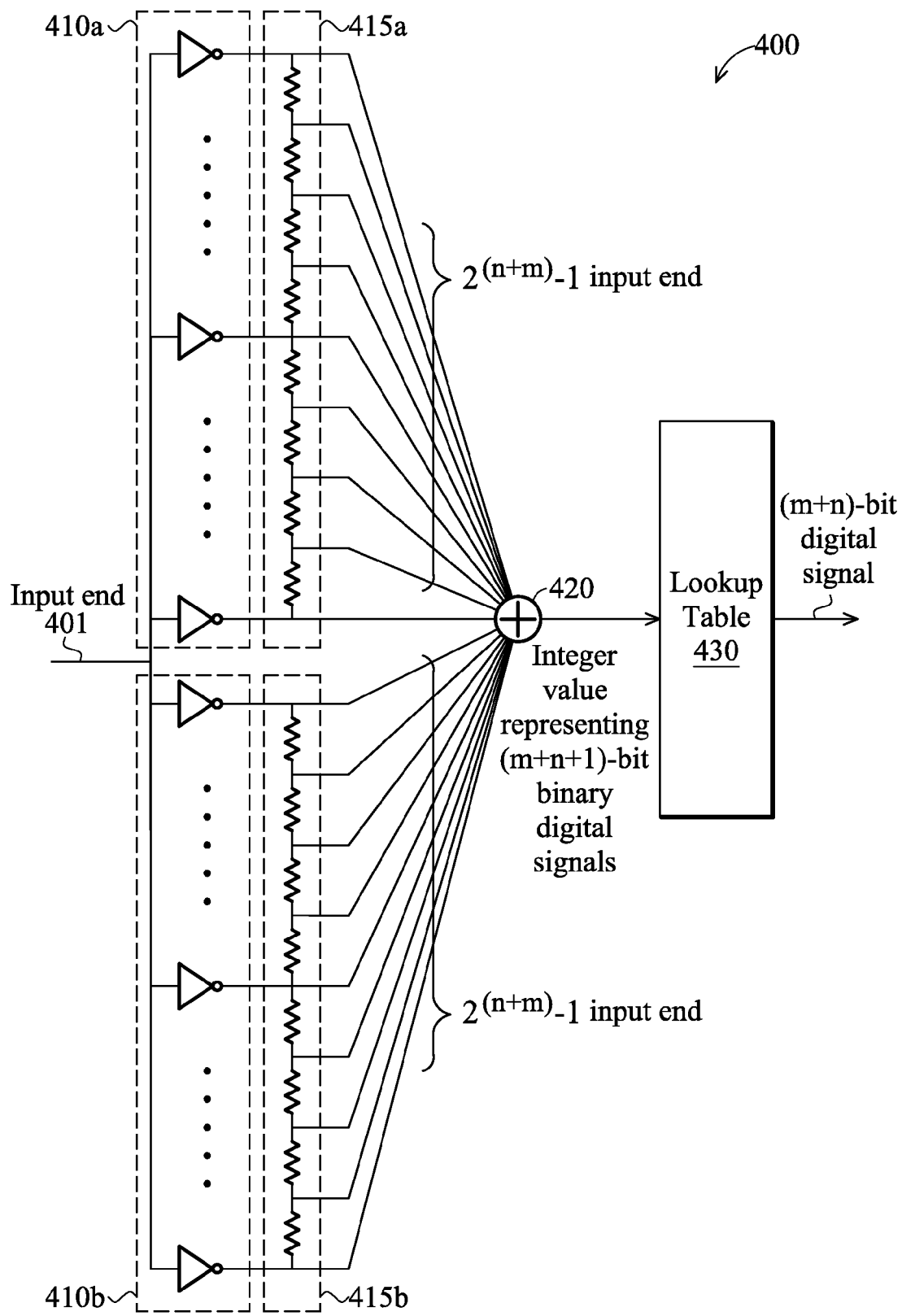
FIG. 4 is a schematic drawing illustrating an exemplary integrated circuit that can convert an analog signal to a digital signal.

FIG. 4 is a schematic drawing illustrating another exemplary integrated circuit that can convert an analog signal to a digital signal. In some embodiments, the numbers of the inverters and the electronic components described above in conjunction with FIG. 1B can be doubled to further quantize the analog signal. In this embodiment, an integrated circuit 400 can include an input end 401 that is capable of receiving an analog signal. The integrated circuit 100 can include a first set of $2^n-1$ inverters 410a, a second set of $2^n-1$ inverters 410b, a first set of $2^n$ voltage dividers 415a, and a second set of $2^n$ voltage dividers 415b. In some embodiments, each of the first and second sets of $2^n-1$ inverters 410a and 410b can be similar to the $2^n-1$ inverters 110 or 160 described above in conjunction with FIGS. 1A and 1B. Each of the first and second sets of $2^n$ voltage dividers 415a and 415b can be similar to the voltage divider 160 described above in conjunction with FIG. 1B.

As noted, the first set of $2^n-1$ inverters 410a and the first set of $2^n$ voltage dividers 415a including $2^{(n+m)}$ electronic components can provide a set of $2^{(n+m)}-1$ digital values. The second set of $2^n-1$ inverters 410b and the second set of $2^n$ voltage dividers 415b including $2^{(n+m)}$ electronic components can provide another set of $2^{(n+m)}-1$ digital values. The adder 420 can sum the $2\times(2^{(n+m)}-1)$ digital values, outputting an integer value that can represent a (n+m+1)-bit binary digital signal. In some embodiments, the integer value that can represent a (n+m+1)-bit binary digital signal output from the adder 420 can be decoded as a (n+m+1)-bit binary digital signal.

In other embodiments, the integer value that can represent a (n+m+1)-bit binary digital signal output from the adder 420 can be converted as a (n+m)-bit binary digital signal. Referring to FIG. 4, the integrated circuit 400 can include a lookup table 430. The lookup table 430 can include a plurality of data including integer values and their corresponding (n+m)-bit binary digital signals. The lookup table 420 can receive the integer value from the adder 420, providing a (n+m)-bit binary digital signal corresponding to the integer value. For example, the look up table 420 can receive an integer value that can represent a 9-bit binary digital signal, outputting an 8-bit binary digital signal. Since more levels are provided for quantizing the analog signal, the preciseness and/or resolution of the quantization of the analog signal can be desirably achieved.

Figure 5:
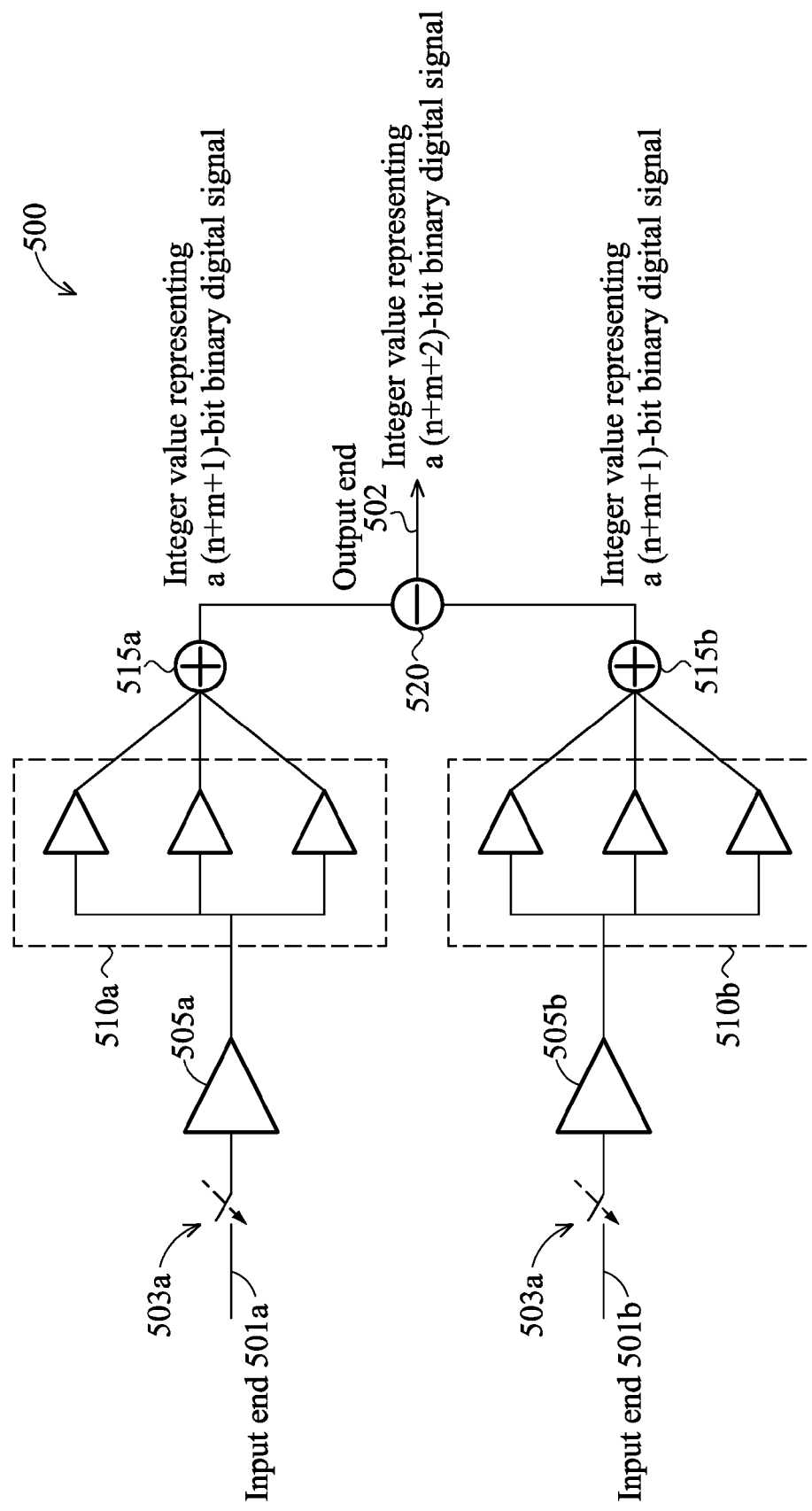
FIG. 5 is a schematic drawing illustrating another exemplary integrated circuit for converting an analog signal to a digital signal.

FIG. 5 is a schematic drawing illustrating an exemplary integrated circuit for converting an analog signal to a digital signal. In some embodiments, an integrated circuit 500 can receive differential inputs for desirably reducing a signal-to-noise ratio (SNR). In FIG. 5, the integrated circuit 500 can include a first input end 501a, e.g., a positive input end, and a second input end 501b, e.g., a negative input end. The first input end 501a can receive a first analog signal and the second input end 501b can receive a second analog signal. In some embodiments, the first analog signal is similar to the second analog signal. In other embodiments, the first analog signal and the second analog signal can have a phase difference, for example, of about 180 degrees. In still other embodiments, the inputs at the first input end 501a and the second input end 501b can be referred to as differential inputs.

In some embodiments, the integrated circuit 500 can include sample and hold circuits 503a and 503b, which are coupled with the first input end 501a and the second input end 501b, respectively. The sample and hold circuits 503a and 503b can be configured to sample and hold the first and second analog signals for a desired time.

In some embodiments, the integrated circuit 500 can include analog buffers 505a and 505b, which can be coupled with the sample and hold circuits 503a and 503b, respectively. The integrated circuit 500 can include quantizers 510a and 510b, which can be coupled with the analog buffers 505a and 505b, respectively. In some embodiments, each of the quantizers 510a and 510b can include the inverters 410a-410b and/or the voltage dividers 415a-415b described above in conjunction with FIG. 4. The quantizers 510a and 510b can be coupled with adders 515a and 515b, respectively. The integrated circuit 500 can include a subtractor 520, which can be coupled with the adders 515a and 515b.

As noted, each of the adders 515a and 515b can output an integer value that can represent a (n+m−1)-bit binary digital signal as described above in conjunction with FIG. 4. The subtractor 520 can be configured to perform a subtraction for the integer values provided by the adders 515a and 516b, outputting an integer value that can represent a (n+m+2)-bit binary digital signal. For example, each of the adders 515a and 515b can output an integer value that can represent a 9-bit binary digital signal. The subtractor 520 can perform a subtraction for the integer values from the adders 515a and 516b, outputting an integer value that can represent a 10-bit binary digital signal.

It is found that the integrated circuit 500 can provide a (n+m+2)-bit analog-to-digital conversion resolution, which is higher than that of the integrated circuit 400 described above in conjunction with FIG. 4. It is also noted that the integrated circuit 500 can desirably reduce a signal-to-noise ratio (SNR) for analog-to-digital conversions.

In some embodiments, the subtractor 520 can be coupled with a lookup table (not shown) as the lookup table 430 described above in conjunction with FIG. 4. The lookup table can desirably receive the an integer value that can represent a (n+m+2)-bit binary digital signal, outputting a (n+m+1)-bit binary digital signal to achieve desired analog-to-digital conversion preciseness and/or resolution.

Figure 6:
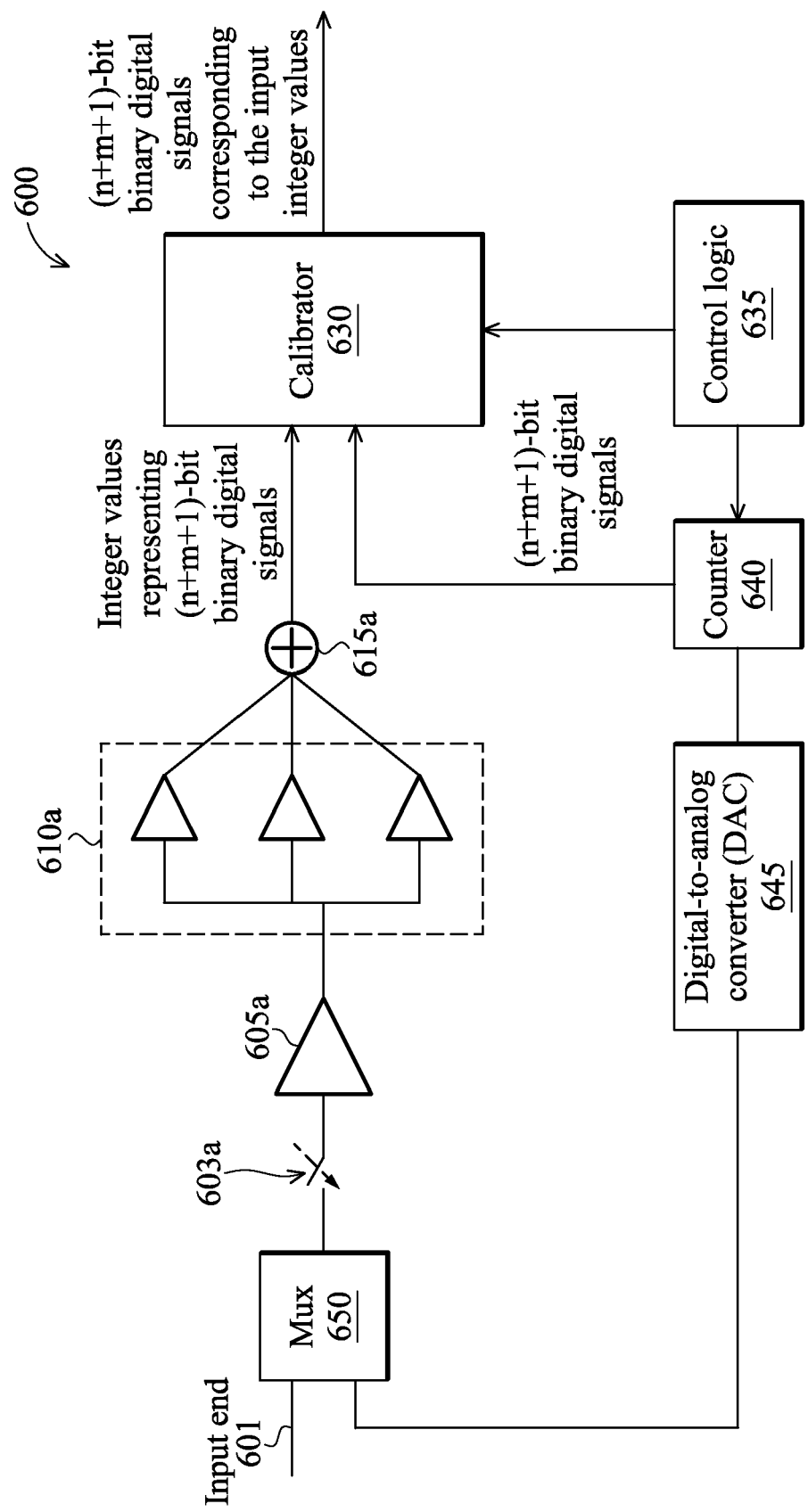
FIG. 6 is a schematic drawing illustrating an exemplary integrated circuit including a calibrator for converting an analog signal to a digital signal.

FIG. 6 is a schematic drawing illustrating an exemplary integrated circuit including a calibrator for converting an analog signal to a digital signal. Items of FIG. 6 that are the same items in FIG. 5 are indicated by the same reference numerals increased by 100. The integrated circuit 600 can include a calibrator 630. The calibrator 630 can be configured to receive the integer value from the adder 615a, outputting a calibrated digital signal corresponding to the integer value. In some embodiments, the operation of the calibrator 630 can be referred to as a ramp calibration.

In some embodiments, the integrated circuit 600 can include a control logic 635 that can be coupled with the calibrator 630. A counter 640 can be coupled with the control logic 635 can the calibrator 630. A digital-to-analog converter (DAC) 645 can be coupled with the counter 640. A multiplexer (mux) 650 can be coupled with the DAC 645 and the sample and hold circuit 603a.

Referring to FIG. 6, the control logic 635 can enable and/or trigger the calibrator 630 and/or the counter 640. In embodiments using a ramp calibration, the counter 640 can output ramp (m+n+1)-bit binary digital signals to the calibrator 630 and the DAC 645. The calibrator 630 can record the (m+n+1)-bit binary digital signals output from the counter 640. The DAC 645 can convert the (m+n+1)-bit binary digital signals from the counter 640 to an analog signal that can be applied to the mux 650a.

For calibration, the mux 650a can output the analog signal from the DAC 645 to the quantizer 610a. As noted, the adder 615a can output integer values representing (m+n+1)-bit binary digital signals to the calibrator 630. The calibrator 630 can record the output integer values representing the (m+n+1)-bit digital signals and/or match the output integer values with their corresponding (m+n+1)-bit digital signals from the counter 640. In some embodiments, the integer values and the (m+n+1)-bit digital signals can be recorded in a calibration table or memory (not shown).

If an analog signal to be converted is provided from the input end 601, the mux 650a can output the analog signal from the input end 601 to the sample and hold circuit 603a, the analog buffer 605a, to the quantizer 610a. The adder 615a can sum the digital values from the quantizer 610a, outputting integer values representing (n+m+1)-bit binary digital signals to the calibrator 630. The calibrator 630 can receive the integer values, outputting calibrated digital signals corresponding to the integer values based on the calibration table.

Figure 7:
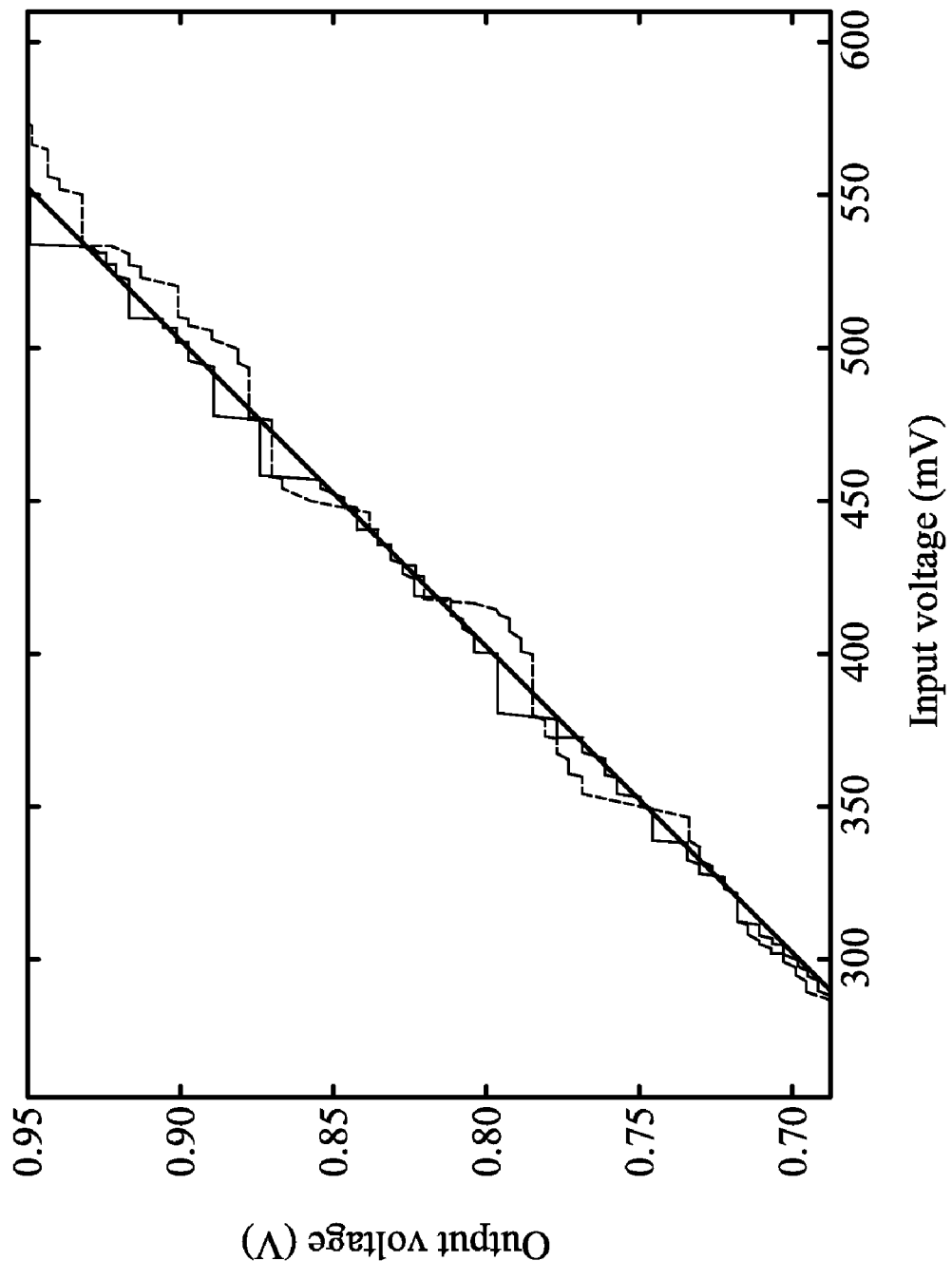
FIG. 7 is a schematic drawing illustrating simulation results with and without calibrations.

FIG. 7 is a schematic drawing illustrating simulation results with and without calibrations. In FIG. 7, a line 701 can represent an aiming line passing mid points of ideal ramp transition steps of a digital output. A stair-stepped line 702 can represent a digital output without calibration. A stair-stepped line 703 can represent a digital output with calibration. It is found that without calibration the stair-stepped line 702 may be undesirably deviated from the line 701 at some levels. The deviation may be resulted from device mismatches, process shifts, and/or any other factors that can affect the resolution of the analog-to-digital conversions.

Compared with the stair-stepped line 702, the stair-stepped line 703 representing the digital output with calibration can desirably approach the line 701. By using calibration described above in conjunction with FIG. 6, the analog-to-digital conversion resolution and/or preciseness can be desirably achieved.

It is noted that the calibration process, the calibrator 630, the logic circuit 635, the counter 640, and/or the DAC 645 can be applied to the integrated circuits 100, 150, 400, and 500 described above in conjunction with FIGS. 1A-1B, and 400-500.

Figure 8:
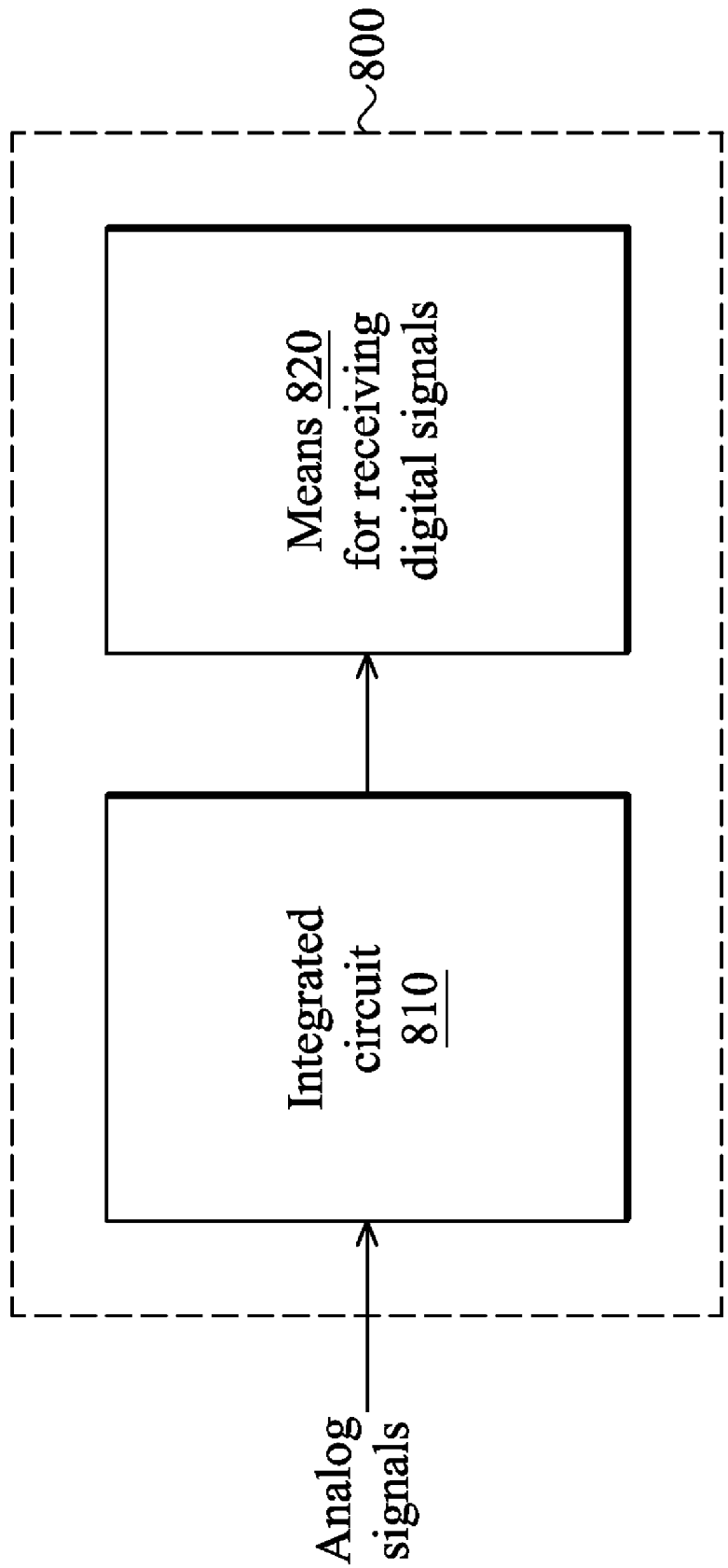
FIG. 8 is a schematic drawing showing a system including an exemplary integrated circuit coupled with a means for receiving digital signals.

FIG. 8 is a schematic drawing showing a system including an exemplary integrated circuit coupled with a means for receiving digital signals. In FIG. 8, a system 800 can include an integrated circuit 810 coupled with a means 820 for receiving digital signals. The integrated circuit 810 can receive analog signals internally, e.g., from a device or circuit within the system 800, or externally, e.g., outside of the system 800. In some embodiments, the integrated circuit 810 can be similar to one of the integrated circuits 100, 150, 400, 500, and 600 described above in conjunction with FIGS. 1A-1B and 4-6.

In some embodiments, the system 800 can include a hard disk driver, a digital versatile disc, a high definition television, a vehicle, a cell phone, a set top box, a media player, or any system that can have analog-to-digital conversions. The means 820 for receiving digital signals can be, for example, a memory, a storage medium, a display, a logic circuit, and/or other circuit that can receive digital signals.

In some embodiments, the integrated circuit 810 and the means 820 for receiving digital signals can be physically and electrically coupled with a printed wiring board or printed circuit board (PCB) to form an electronic assembly. The electronic assembly can be part of an electronic system such as computers, wireless communication devices, computer-related peripherals, entertainment devices, or the like.

In some embodiments, the system 800 including the integrated circuit 810 can provides an entire system in one IC, so-called system on a chip (SOC) or system on integrated circuit (SOIC) devices. These SOC devices may provide, for example, all of the circuitry needed to implement a cell phone, personal data assistant (PDA), digital VCR, digital camcorder, digital camera, MP3 player, or the like in a single integrated circuit.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit being capable of converting an analog signal to at least one digital signal, the integrated circuit comprising:
    a first input end capable of receiving a first single analog signal;
    a first set of $2^n-1$ inverters directly connected to the first input end, the first set of $2^n-1$ inverters each receiving the first single analog signal and being capable of quantizing the first single analog signal and outputting a first set of $2^n-1$ digital values, each of the first set of $2^n-1$ digital values being either 0 or 1 and $n \geq 2$; and
    a first adder coupled with the first set of $2^n-1$ inverters, the first adder being capable of summing the first set of $2^n-1$ digital values, outputting a first integer value that is capable of corresponding to at least one digital signal.

2. The integrated circuit of claim 1 further comprising:
    a first set of voltage dividers, wherein each output end of the first set of $2^n-1$ inverters is coupled with at least one of the first set of voltage dividers, each of the first set of voltage dividers comprises a first set of $2^m$ electronic components, each of the first set of voltage dividers is capable of quantizing the first single analog signal and outputting a first set of $2^m-1$ digital values, each of the first set of $2^m-1$ digital values being either 0 or 1, and the first adder is capable of summing the first set of $2^n-1$ digital values and the first set of $2^m-1$ digital values of each of the first set of voltage dividers, outputting a second integer value that is capable of corresponding to the at least one digital signal.

3. The integrated circuit of claim 2 further comprising:
    a second set of $2^n-1$ inverters, the second set of $2^n-1$ inverters being disposed parallel with the first set of $2^n-1$ inverters and coupled with the first adder, wherein the second set of $2^n-1$ inverters is capable of quantizing the first single analog signal and outputting a second set of $2^n-1$ digital values, each of the second set of $2^n-1$ digital values being either 0 or 1; and
    a second set of voltage dividers, wherein each output end of the second set of $2^n-1$ inverters is coupled with at least one of the second set of voltage dividers, each of the second set of voltage dividers comprises a second set of $2^m$ electronic components, each of the second set of voltage dividers is capable of quantizing the first single analog signal and outputting a second set of $2^m-1$ digital values, each of the first set of $2^m-1$ digital values being either 0 or 1, and the first adder is capable of summing the first set of $2^n-1$ digital values, the second set of $2^n-1$ digital values, the first set of $2^m-1$ digital values of each of the first set of voltage dividers, and the second set of $2^m-1$ digital values of each of the second set of voltage dividers, outputting a third integer value that is capable of corresponding to the at least one digital signal.

4. The integrated circuit of claim 1 further comprising:
    a second input end capable of receiving a second single analog signal, wherein the first single analog signal and the second single analog signal have a phase difference;
    a first sample and hold circuit coupled with the first input end and a second sample and hold circuit coupled with the second input end, the first and second sample and hold circuits being configured to hold the first signal analog signal and the second single analog signal respectively, for a desired time;
    a first buffer circuit coupled with the first sample and hold circuit and a second buffer circuit coupled with the second sample and hold circuit;
    the first set of $2^n-1$ inverters coupled with the first buffer circuit;
    a third set of $2^n-1$ inverters coupled with the second buffer circuit, the third set of $2^n-1$ inverters being capable of quantizing the second single analog signal and outputting a third set of $2^n-1$ digital values, each of the third set of $2^n-1$ digital values being either 0 or 1;
    a second adder coupled with the third set of $2^n-1$ inverters, the second adder being configured to sum the third set of $2^n-1$ digital values, outputting a fourth integer value corresponding to the second single analog signal; and
    a subtractor coupled with the first adder and the second adder, wherein the subtractor is configured to perform a subtraction for the first integer value and the fourth integer value for providing a fifth integer value that is capable of corresponding to that at least one digital signal.

5. The integrated circuit of claim 1 further comprising:
    a lookup table coupled with the first adder, wherein the lookup table is capable of outputting a binary digital signal corresponding to the first integer value.

6. The integrated circuit of claim 1 further comprising:
    a calibrator coupled with the first adder, wherein the calibrator is configured to receive the first integer value and output a calibrated digital signal corresponding to the first integer value.

7. The integrated circuit of claim 6 further comprising:
    a counter coupled with the calibrator; and
    a digital-to-analog converter (DAC) coupled with the calibrator and the first set of $2^n$ inverters.

8. A system comprising:
    an integrated circuit, the integrated circuit being capable of converting a first single analog signal to at least one digital signal, the integrated circuit comprising:
        a first input end capable of receiving the first single analog signal;
        a first set of $2^n-1$ inverters directly connected to the first input end, the first set of $2^n-1$ inverters receiving the first single analog signal and being capable of quantizing the first single analog signal and outputting a first set of $2^n-1$ digital values, each of the first set of $2^n-1$ digital values being either 0 or 1 and $n \geq 2$; and
        a first adder coupled with the first set of $2^n-1$ inverters, the first adder being capable of summing the first set of $2^n-1$ digital values, outputting a first integer value that is capable of corresponding to the at least one digital signal; and
    a means for receiving the at least one digital signal coupled with the integrated circuit.

9. The system of claim 8, wherein the integrated circuit further comprises:
    a first set of voltage dividers, wherein each output end of the first set of $2^n-1$ inverters is coupled with at least one of the first set of voltage dividers, each of the first set of voltage dividers comprises a first set of $2^m$ electronic components, each of the first set of voltage dividers is capable of quantizing the first single analog signal and outputting a first set of $2^m-1$ digital values, each of the first set of $2^m-1$ digital values being either 0 or 1, and the first adder is capable of summing the first set of $2^n-1$ digital values and the first set of $2^m-1$ digital values of each of the first set of voltage dividers, outputting a second integer value that is capable of corresponding to the at least one digital signal.

10. The system of claim 9, wherein the integrated circuit further comprises:
a second set of $2^n-1$ inverters, the second set of $2^n-1$ inverters being disposed parallel with the first set of $2^n-1$ inverters and coupled with the first adder, wherein the second set of $2^n-1$ inverters is capable of quantizing the first single analog signal and outputting a second set of $2^n-1$ digital values, each of the second set of $2^n-1$ digital values being either 0 or 1; and
a second set of voltage dividers, wherein each output end of the second set of $2^n-1$ inverters is coupled with at least one of the second set of voltage dividers, each of the second set of voltage dividers comprises a second set of $2^m$ electronic components, each of the second set of voltage dividers is capable of quantizing the first analog signal and outputting a second set of $2^m-1$ digital values, each of the first set of $2^m-1$ digital values being either 0 or 1, and the first adder is capable of summing the first set of $2^m-1$ digital values, the second set of $2^n-1$ digital values, the first set of $2^m-1$ digital values of each of the first set of voltage dividers, and the second set of $2^m-1$ digital values of each of the second set of voltage dividers, outputting a third integer value that is capable of corresponding to the at least one digital signal.

11. The system of claim 8, wherein the integrated circuit further comprises:
a second input end capable of receiving a second single analog signal, wherein the first single analog signal and the second single analog signal have a phase difference;
a first sample and hold circuit coupled with the first input end and a second sample and hold circuit coupled with the second input end, the first and second sample and hold circuits being configured to hold the first signal analog signal and the second single analog signal respectively, for a desired time;
a first buffer circuit coupled with the first sample and hold circuit and a second buffer circuit coupled with the second sample and hold circuit;
the first set of $2^n-1$ inverters coupled with the first buffer circuit;
a third set of $2^n-1$ inverters coupled with the second buffer circuit, the third set of $2^n-1$ inverters being capable of quantizing the second single analog signal and outputting a third set of $2^n-1$ digital values, each of the third set of $2^n-1$ digital values being either 0 or 1;
a second adder coupled with the third set of $2^n-1$ inverters, the second adder being configured to sum the third set of $2^n-1$ digital values, outputting a fourth integer value corresponding to the second single analog signal; and
a subtractor coupled with the first adder and the second adder, wherein the subtractor is configured to perform a subtraction for the first integer value and the fourth integer value for providing a fifth integer value that is capable of corresponding to the at least one digital signal.

12. The system of claim 8, wherein the integrated circuit further comprises:
a lookup table coupled with the first adder, wherein the lookup table is capable of outputting a binary digital signal corresponding to the first integer value.

13. The system of claim 8, wherein the integrated circuit further comprises:

a calibrator coupled with the first adder, wherein the calibrator is configured to receive the first integer value and output a calibrated digital signal corresponding to the first integer value.

14. The system of claim 13, wherein the integrated circuit further comprises:
a counter coupled with the calibrator; and
a digital-to-analog converter (DAC) coupled with the calibrator and the first set of $2^n$ inverters.

15. A method for converting at least one analog signal to at least one digital signal, the method comprising:
receiving a first single analog signal at a first input end, and inputting the first analog signal into a first set of 2n-1 inverters directly connected to the first input end;
quantizing the first single analog signal by the first set of $2^n-1$ inverters wherein $n \geq 2$ for providing a first set of $2^n-1$ integer values; and
summing by a first adder, the first set of $2^n-1$ integer values to provide a first integer value, wherein the first integer value is capable of being corresponding to at least one digital signal.

16. The method of claim 15 further comprising:
quantizing the first single analog signal by a first set of voltage dividers, each of the first set of voltage dividers being coupled with at least one of the first set of $2^n-1$ integer values, each of first set of the voltage dividers being capable of providing a first set of $2^m-1$ digital values; and
summing the first set of $2^n-1$ integer values and the first set of $2^m-1$ integer values of each of the first set of voltage dividers for providing a second integer value that is capable of corresponding to the at least one digital signal.

17. The method of claim 16 further comprising:
quantizing the first single analog signal by a second set of $2^n-1$ inverters for providing a second set of $2^n-1$ integer values;
quantizing the first single analog signal by a second set of voltage dividers, each of the second set of voltage dividers being coupled with at least one of the second set of $2^n-1$ integer values, each of second set of the voltage dividers being capable of providing a second set of $2^m-1$ digital values; and
summing the first set of $2^n-1$ integer values, the second set of $2^n-1$ integer values, the first set of $2^m-1$ integer values of each of the first set of voltage dividers, and the second set of $2^m-1$ integer values of each of the second set of voltage dividers for providing a third integer value that is capable of corresponding to the at least one digital signal.

18. The method of claim 15 further comprising:
quantizing a second single analog signal by a third set of $2^n-1$ inverters for providing a third set of $2^n-1$ integer values;
summing the third set of $2^n-1$ integer values to provide a fourth integer value; and
operating a subtraction for the first integer value and the fourth integer value for providing a fifth integer value that is capable of corresponding to the at least one digital signal.

19. The method of claim 15 further comprising:
calibrating the first integer value; and
outputting a calibrated digital signal corresponding to the first integer value.

* * * * *

UNITED STATES PATENT AND TRADEMARK OFFICE
CERTIFICATE OF CORRECTION

PATENT NO.        : 8,362,937 B2                                    Page 1 of 1
APPLICATION NO.   : 12/791963
DATED             : January 29, 2013
INVENTOR(S)       : Shine Chung It is certified that error appears in the above-identified patent and that said Letters Patent is hereby corrected as shown below:

In the Claims

On Column 12, lines 12-14 (Claim 15), should read as follows:

receiving a first single analog signal at a first input end, and inputting the first single analog signal into a first set of $2^n - 1$ inverters directly connected to the first input end;

Signed and Sealed this
Twenty-eighth Day of April, 2015

Michelle K. Lee
*Director of the United States Patent and Trademark Office*